US009076668B2

(12) United States Patent
Jing et al.

(10) Patent No.: US 9,076,668 B2
(45) Date of Patent: Jul. 7, 2015

(54) METHOD OF MANUFACTURING THE TRENCH OF U-SHAPE

(71) Applicant: Shanghai Huali Microelectronics Corporation, Shanghai (CN)

(72) Inventors: XuBin Jing, Shanghai (CN); Fang Li, Shanghai (CN); WenYan Liu, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 80 days.

(21) Appl. No.: 14/070,060

(22) Filed: Nov. 1, 2013

(65) Prior Publication Data

US 2014/0273388 A1   Sep. 18, 2014

(30) Foreign Application Priority Data

Mar. 14, 2013   (CN) .......................... 2013 1 0081961

(51) Int. Cl.
| | |
|---|---|
| *H01L 21/8238* | (2006.01) |
| *H01L 29/08* | (2006.01) |
| *H01L 29/66* | (2006.01) |
| *H01L 21/4757* | (2006.01) |
| *H01L 27/092* | (2006.01) |

(52) U.S. Cl.
CPC ...... *H01L 29/0847* (2013.01); *H01L 29/66477* (2013.01); *H01L 21/823878* (2013.01); *H01L 21/47576* (2013.01); *H01L 27/092* (2013.01); *H01L 21/823807* (2013.01); *H01L 21/823814* (2013.01)

(58) Field of Classification Search
CPC ....... H01L 21/44; H01L 21/441; H01L 21/46; H01L 21/461; H01L 21/469; H01L 21/47; H01L 21/4757; H01L 21/47573; H01L 21/47576; H01L 21/8232
See application file for complete search history.

(56) References Cited

U.S. PATENT DOCUMENTS

2013/0320449 A1* 12/2013 Hoentschel et al. .......... 257/368

FOREIGN PATENT DOCUMENTS

| CN | 102254817 A | 11/2011 |
|---|---|---|
| CN | 102683180 A | 9/2012 |

* cited by examiner

*Primary Examiner* — Cheung Lee
(74) *Attorney, Agent, or Firm* — Levenfeld Pearlstein, LLC

(57) ABSTRACT

The present invention relates to the manufacture of CMOS semiconductor device. This invention includes: Step S1, a layer of silicon oxide is deposited covering the surface of the polysilicon gates and the exposed upper surface of the silicon substrate, the silicon oxide layer is removed on the upper surface of the exposed silicon substrate, and then the barrier layer is formed at the surface of the polysilicon gates; Step S2, the ions are implanted into the exposed substrate, and then several doped silicon regions are formed in the silicon substrate; Step S3, the doped silicon regions are etched to form the trench of U-shape, then the barrier layer is removed. The present invention protects the polysilicon gate and the substrate during the process of forming the trench. The rate of etching is increased and the productivity is improved and it is possible to control the depth of the U-shaped trench.

9 Claims, 3 Drawing Sheets

METHOD OF MANUFACTURING THE TRENCH OF U-SHAPE

CROSS-REFERENCE TO RELATED APPLICATIONS

The present application claims priority under the Paris Convention to Chinese application number CN 201310081961.5, filed on Mar. 14, 2013, the disclosure of which is herewith incorporated by reference in its entirety.

FIELD

The present invention relates to the manufacture of CMOS semiconductor devices, and in particular to a method for manufacturing a U-shaped trench.

BACKGROUND

With the improvement of semiconductor manufacturing and the development of the art of CMOS semiconductor devices, the size of semiconductors has become smaller and smaller. It has become necessary to introduce the stress technology of silicon into the manufacturing process of semiconductors for improving the performance of the devices. At present, the ordinary stress technology of silicon in PMOS devices is the SiGe process. SiGe process is with great effect of radio frequency.

Moreover, to its high price-performance ratio, it is widely used in the markets of mobile telecommunication, satellite positioning and RFID (Radio Frequency IDentification). Furthermore, the SiGe process can be integrated into the common mixed analog-digital circuits, which is adopted to manufacture full functional SoC chips (system on chip). It has become a hot topic for utilizing SiGe to manufacture radio frequency integrated circuit and has become a hot spot for research all over the world. Bandwidth and frequency become more and higher due to the wide application of radio. Hence, it is important to research the application of the radio of broadband and ultra-wideband.

The manufacturing process requires forming a trench of silicon on the wafer. The shape of a present trench is U-shape or Σ-shape. In prior known methods, dry etching is used to form the U-shaped trench. In such methods, a layer of hard mask is prefabricated. When the trench is formed, the layer of hard mask has to be removed. Consequently, as a result, the cost thereof is relatively high. Furthermore, it is easy to break the monocrystalline silicon when etching, and the nucleation of SiGe is affected. Therefore, it causes some adverse effect in the manufacturing products.

China Patent (CN 102683180A) discloses a method for etching the trench and a method for manufacturing the semiconductor device. The method comprises coating photo-resist with a certain thickness on a silicon wafer, forming a pattern for etching a channel of the photo-resist, and executing plasma etching by utilizing the photo-resist on which the pattern is formed. The specific thickness of the photo-resist and the etching energy in a plasma etching process are controlled, so that the photo-resist is consumed by plasma to etch a silicon wafer below the photo-resist.

This provides a method of forming the trench with a circular contour, the etching rate is low in the actual process of etching, and there is no protection in the process of etching. As such, it is likely to damage the other parts of the layer which do not need to be etched. Consequently, there are some limitations with this method.

China Patent (CN 102254817A) discloses a method for manufacturing the trench that includes providing a silicon substrate, growing oxides or nitrides on the silicon substrate, coating a photoresist, allowing the photoresist to form a pattern, performing trench etching by use of the photoresist mask which forms the patterns, removing the photoresist mask, washing, and performing hydrogen annealing.

This method requires a long time to form the trench and the etching rate is low. As such, this method is not suitable for the development of the semiconductor industry in manufacturing the trench.

SUMMARY

A method of manufacturing a U-shaped trench, forms a barrier layer at the surface of the polysilicon gate, and then ions are implanted into the exposed substrate. As a result, some doped silicon regions are formed in the silicon substrate. The doped silicon regions are then removed by wet etching with hot phosphoric acid to form the U-shaped trench. The method can protect the silicon substrate and increase the etching rate.

In a method for forming the U-shaped trench, which is applied in the semiconductor structure with polysilicon gates, the structure comprises a silicon substrate and several polysilicon gates. The polysilicon gates are disposed at the upper surface of the silicon substrate. The method includes the following steps:

In step S1, a layer of silicon oxide is deposited covering the surface of the polysilicon gates and the upper surface of the exposed silicon substrate. The silicon oxide layer on the upper surface of the exposed silicon substrate is removed, and a barrier layer at the surface of the polysilicon gates is formed.

In step S2, ions are implanted into the substrate, forming one or more doped silicon regions in the silicon substrate.

In step S3, the U-shaped trench is formed by etching the doped silicon regions, and then the barrier layer is formed.

In accordance with this method, the silicon oxide layer in the step S1 can be a layer of silica. The thickness of the silicon oxide layer in the step S1 can range from 200 Å to 600 Å.

In step S2, a layer of photoresist can be coated covering the upper surface of the exposed silicon substrate and the surface of the barrier layer. After exposing and developing the photoresist, a patterned photoresist is formed, the patterned photoresist covering parts of the barrier layer at the surface of the polysilicon gates and parts of the upper surface of the silicon substrate. The patterned photoresist is used as a mask when the ions are implanted into the exposed silicon substrate. When the one or more doped silicon regions are formed in the silicon substrate, the mask is removed.

In an embodiment of the method the dosage of the ions is greater than or equal to 1E15 atom/cm2. The ions can be Ge ions, As ions, P ions or B ions.

The mask can be removed by dry etching. The doped silicon regions can be removed by wet etching with hot phosphoric acid in step S3, and the barrier layer can be removed by wet etching with hydrofluoric acid in step S3.

The advantageous effects of the above technical solution are many. For example, the method greatly protects the polysilicon gate and the substrate during the process of forming the trench. The high-dosage of the doping ion in the substrate needs to form the U-shaped trench by etching, and then the substrate is etched by hot phosphoric acid, which increases the rate of etching and improves the productivity. Moreover, it provides for controlling the depth of the U-shaped trench by changing the dosage of ion implantation. It also provides for controlling the distance between the trenches and the channel of the device by adjust the depth of the silica layer.

DESCRIPTION OF THE DRAWINGS

FIGS. 1-6 are flow structure diagrams of an exemplary method for manufacturing a U-shaped trench, wherein:

FIG. 1 illustrates a structure following step 1 of the method;
FIG. 2 illustrates a photoresist on the structure of FIG. 1;
FIG. 3 illustrates a structure following step 2 of the method;
FIG. 4 illustrates a structure following step 3 of the method;
FIG. 5 illustrates a structure following step 4 of the method; and
FIG. 6 illustrates a structure following step 5 of the method.

DETAILED DESCRIPTION

The present disclosure will be further illustrated in combination with the following figures and embodiments, but it should not be deemed as a limitation of the appended claims.

Figure 1:
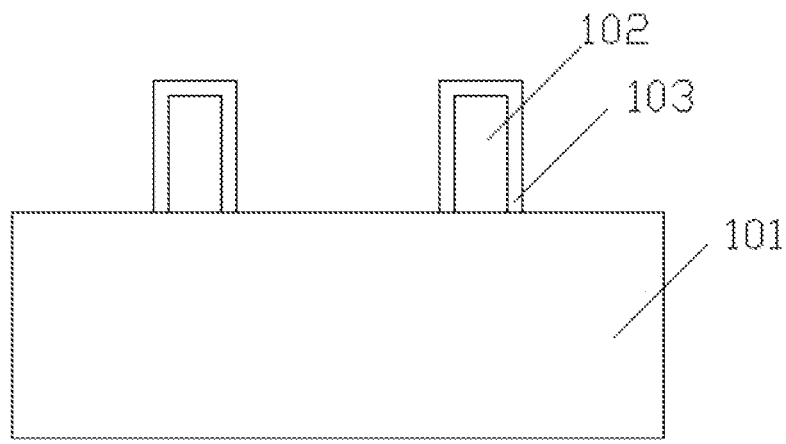
Figure 2:
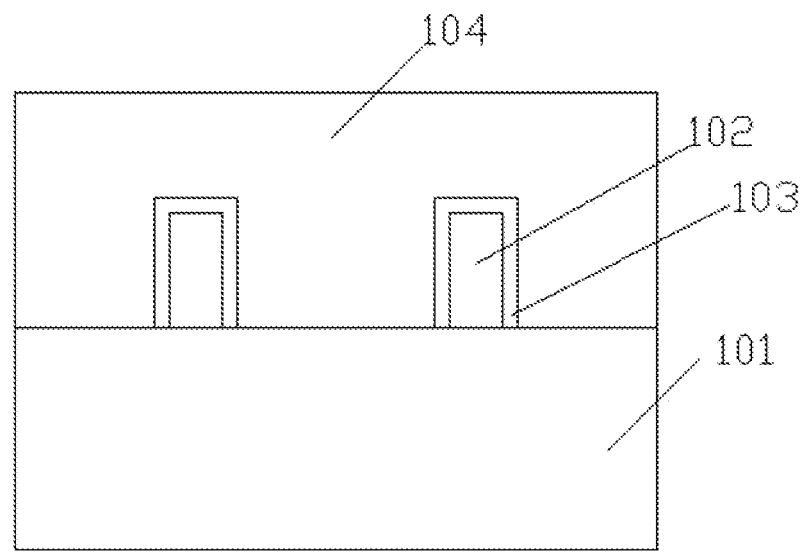

FIGS. 1-6 are structure diagrams illustrating an exemplary embodiment of a method for manufacturing a U-shaped trench. The method consists of the following steps:

In step 1, a layer of silica is deposited at the upper surface of the silicon substrate 101, and in an embodiment of the present method, the thickness of the silica layer is in a range from 200 Å to 600 Å, such as 300 Å, 500 Å. The upper surface of polysilicon gate 102 is covered by the silica layer, the silica layer is removed by etching, and then a barrier layer 103 of silicon monoxide is formed at the surface of the polysilicon gate. When step 1 is complete, a structure is formed as shown in FIG. 1.

Figure 3:
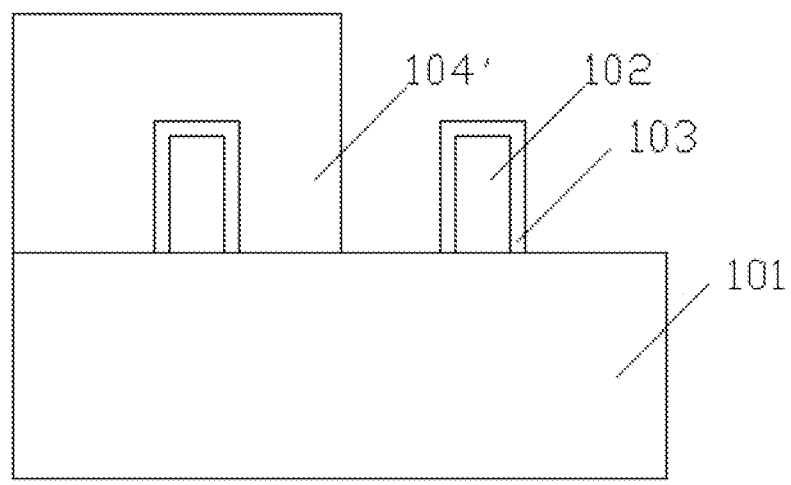

In step 2, a layer of photoresist 104 is coated at the surface of the exposed silicon substrate 101. The barrier layer 103, which is disposed on the surface of polysilicon gate 102 is covered by the layer of photoresist, resulting in the structure shown in FIG. 2. The spare parts of the photoresist are removed after the exposure process and developing process. As a result, photoresist 104' is formed. The process window of etching the region which needs to be etched to form the trench is open. Parts of the barrier layer 103 at the surface of the polysilicon gate and the parts of the upper surface of the silicon substrate 101 are all covered by the photoresist 104'. When this step is complete, the structure as shown in FIG. 3 is formed.

Figure 4:
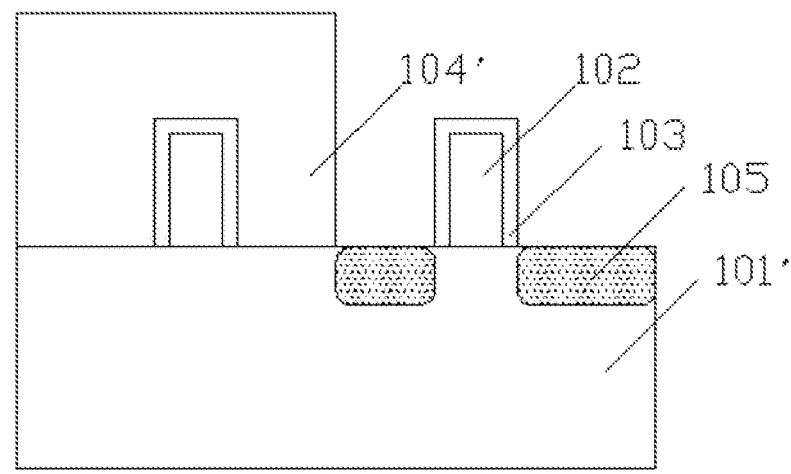

In step 3, photoresist 104' is used as a mask to implant ions at a high dosage. The ions can be one of the following ions, i.e., Ge, As, P or B. The dosage is above 1E15 atom/cm2. The doped silicon region 105 is formed at the position that is below the upper surface of the exposed silicon substrate. The doped silicon region 105 is located at the two sides of the lower surface of polysilicon gate 102. When Step 3 is complete, the structure as shown in FIG. 4 is formed.

Figure 5:
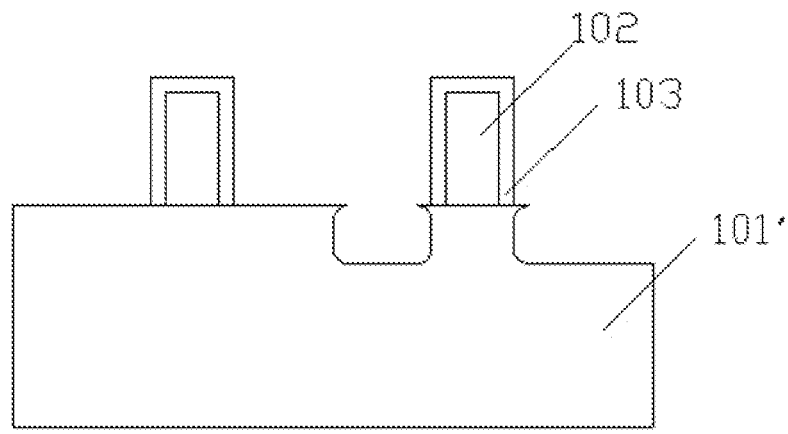

In step 4, dry etching is adopted to remove photoresist 104' which is at the upper surface of silicon substrate 101' and at the most of the surface of barrier layer 103. Doped silicon region 105 is removed by wet etching with hot phosphoric acid. Since the portions of the substrate to be etched have already been doped with ions, the speed of the wet etching is high. It is swift to remove the doped silicon region 105, and then the U-shaped trench is formed in the silicon substrate. Furthermore, the etching selection ratio of the doped silicon is high, so the non-doped region of the silicon substrate is protected from being etched. When step 4 is complete, a structure as shown in FIG. 5 is formed.

Figure 6:
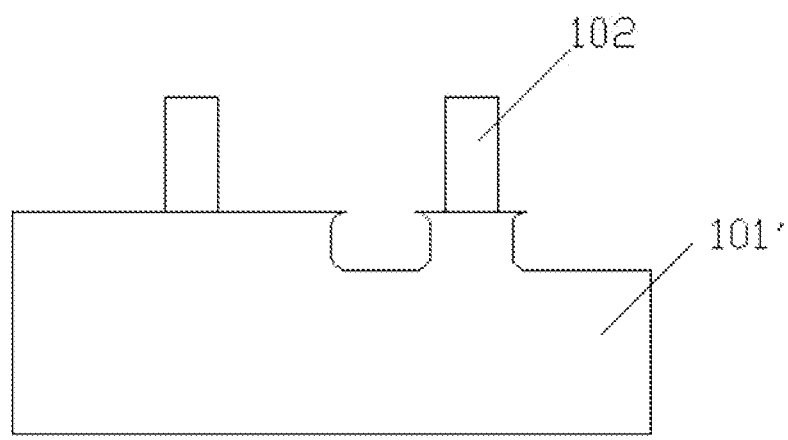

In step 5, barrier layer 103 of silicon oxide is stripped at the surface of the polysilicon gate by wet etching. In an embodiment, barrier layer 103 of silicon oxide is stripped at the surface of the polysilicon gate by wet etching with hydrofluoric acid. When Step 5 is complete, a structure as shown in FIG. 6 is formed.

The ions for implanting can be chosen from the following ions, i.e., Ge, As, P or B, and the dosage of the ion implanting can be over 1E15 atom/cm2. The trench is formed by wet etching with hot phosphoric acid. The etching rate in the ion implantation region is over 15 Å/min. Meanwhile, the etching rate in the non-doped region, is below 1.5 Å/min. Hence, when the substrate which has been doped by ion implantation is etched with hot phosphoric acid, the values of the etching rate in the different regions (the doped regions and the non-doped regions) differ by more than 10 times. Hence, the etch rate of the regions which are ready to form the trench is greatly increased by the ion implanting. As a result, the U-shaped trench will be formed in the silicon substrate at a high rate. Furthermore, the etching rate of hot phosphoric acid is low in the silicon substrate of monocrystalline and in the barrier layer of silica. This reduces the damage of the silicon substrate and the polysilicon gate which are exposed to the hot phosphoric acid. Therefore, the silicon substrate and the polysilicon gate are protected.

In an exemplary embodiment of the method, when step 3 is finished, the As ions are implanted into the substrate. The energy of the As ion implanted is 15 KeV. The dosage of the implanted ion is 2E15. The doped silicon regions with a thickness of 319 Å are formed in the silicon substrate. The doped silicon regions are removed by wet etching with hot phosphoric acid. The U-shaped trench with a thickness of 315 Å is formed in the silicon substrate. The depth of the U-shaped trench is identical to the thickness of the doped silicon regions. Consequently, it achieves the goal of the present method, and meets the requirements of the process. It is thus possible to form a U-shaped trench with different depths according to the dosage of the ion implantation. It is possible to form a trench with large depth by increasing the dosage of the ion implantation, and conversely to form a trench with small depth by decreasing the dosage of the ion implantation.

In summary, the present method protects the polysilicon gate during the process of forming the trench, and can be used to control the depth of the U-shaped trench by changing the dosage of ion implantation. Furthermore, the present method increases the rate of etching, and lowers costs, the equipment can be used universally, and as such, it improves productivity.

Although an exemplary embodiment of a particular structure of the specific method has been disclosed I connection with the above description and figures, it will be appreciated that other changes and modifications based on the scope and spirit of the present disclosure may also be made. Though the preferred embodiments are proposed above, these are not intended to limit the appended claims.

It will be appreciated by those skilled in the art that various changes and modifications after reading the above disclosure can be made. Nevertheless, the appended claims are intended to cover all such changes and modifications as fall within the scope and spirit thereof, including the range of the claims. Any and all equivalent contents and ranges in the range of the claims are intended to be and should be regarded as belonging to the intention and the range of the claims.

The invention claimed is:

1. A method for forming a U-shaped trench in a semiconductor structure with polysilicon gates, the structure having a silicon substrate and one or more polysilicon gates, the polysilicon gates being disposed at an upper surface of the silicon substrate, the method comprising:

depositing a layer of silicon oxide covering a surface of the polysilicon gates and an exposed upper surface of the silicon substrate, the silicon oxide layer on the exposed upper surface of the silicon substrate being removed to form a barrier layer at the surface of the polysilicon gates;

implanting ions into the exposed upper surface of the silicon substrate, and forming one or more doped silicon regions in the silicon substrate, wherein the ions are implanted into some regions of the silicon substrate, along the silicon oxide layer covering a sidewall of a portion of the polysilicon gates to form the doped silicon regions and wherein other portions of the polysilicon gates are covered with a photoresist during the step of implanting ions in the exposed upper surface of the silicon substrate;

etching the entirety of the doped silicon regions to remove the doped silicon and any doped silicon residue to form a U-shaped trench; and removing the barrier layer.

2. The method of claim 1, wherein the silicon oxide layer is a layer of silica.

3. The method of claim 1, wherein a thickness of the silicon oxide layer is in a range from 200 Å to 600 Å.

4. The method of claim 1, wherein the step of implanting ions further includes coating a layer of photoresist on the exposed upper surface of the silicon substrate and a surface of the barrier layer, and after exposing and developing the photoresist, a patterned photoresist is formed, the patterned photoresist covering parts of the barrier layer at the surface of the polysilicon gates and parts of the exposed upper surface of the silicon substrate, and using the patterned photoresist as a mask during the step of implanting ions into the exposed upper surface of the silicon substrate, and, after forming the doped silicon regions in the silicon substrate, removing the mask.

5. The method of claim 4, wherein a dosage of the ions is more than 1E15 atom/cm2.

6. The method of claim 4, wherein the ions are Ge ion, As ion, P ion or B ion.

7. The method of claim 4, wherein the mask is removed by dry etching.

8. The method of claim 1, wherein in the etching step, the doped silicon regions are removed by wet etching with hot phosphoric acid.

9. The method of claim 1, wherein in the etching step, the barrier layer is removed by wet etching with hydrofluoric acid.

* * * * *